(12) United States Patent
Ahn et al.

(10) Patent No.: US 10,889,009 B2
(45) Date of Patent: Jan. 12, 2021

(54) TRANSFER HEAD

(71) Applicant: POINT ENGINEERING CO., LTD., Asan (KR)

(72) Inventors: Bum Mo Ahn, Suwon (KR); Seung Ho Park, Hwaseong (KR); Sung Hyun Byun, Hwaseong (KR)

(73) Assignee: POINT ENGINEERING CO., LTD., Asan (KR)

( * ) Notice: Subject to any disclaimer, the term of this patent is extended or adjusted under 35 U.S.C. 154(b) by 0 days.

(21) Appl. No.: 16/551,566

(22) Filed: Aug. 26, 2019

(65) Prior Publication Data

US 2020/0070364 A1 Mar. 5, 2020

(30) Foreign Application Priority Data

Aug. 29, 2018 (KR) .................. 10-2018-0101899

(51) Int. Cl.
| | | |
|---|---|---|
| *B25J 15/06* | (2006.01) | |
| *B25J 7/00* | (2006.01) | |
| *H01L 33/00* | (2010.01) | |

(52) U.S. Cl.
CPC ............ *B25J 15/0691* (2013.01); *B25J 7/00* (2013.01); *B25J 15/0683* (2013.01); *H01L 33/0095* (2013.01)

(58) Field of Classification Search
None
See application file for complete search history.

(56) References Cited

U.S. PATENT DOCUMENTS

| 2006/0228897 A1* | 10/2006 | Timans ............. H01L 21/67115 438/758 |
| 2016/0236876 A1* | 8/2016 | Eisele .................... B65G 47/91 |
| 2019/0139794 A1* | 5/2019 | Saketi ................. H01L 21/6838 |

FOREIGN PATENT DOCUMENTS

| KR | 100731673 B1 | 6/2007 |
| KR | 20140112486 A | 9/2014 |
| KR | 20170019415 A | 2/2017 |
| KR | 20170024906 A | 3/2017 |
| KR | 20170026959 A | 3/2017 |
| KR | 101754528 B1 | 7/2017 |
| KR | 101757404 B1 | 7/2017 |

* cited by examiner

*Primary Examiner* — Ronald P Jarrett

(57) ABSTRACT

The present invention relates to a transfer head gripping and transferring micro LEDs from a first substrate to a second substrate. More particularly, the present invention relates to a transfer head gripping and transferring micro LEDs in a batch manner without any error even when there is a height difference of the micro LEDs.

4 Claims, 8 Drawing Sheets

TRANSFER HEAD

CROSS REFERENCE TO RELATED APPLICATION

The present application claims priority to Korean Patent Application No. 10-2018-0101899, filed Aug. 29, 2018, the entire content of which is incorporated herein for all purposes by this reference.

BACKGROUND OF THE INVENTION

Field of the Invention

The present invention relates to a transfer head transferring a micro light-emitting diode (micro LED) from a first substrate to a second substrate.

Description of the Related Art

Currently, the display market is still dominated by LCDs, but OLEDs are quickly replacing LCDs and emerging as mainstream products. In a current situation where display makers are rushing to participate in the OLED market, micro light-emitting diode (hereinafter, referred to as micro LED) displays have emerged as another next-generation display. Liquid crystal and organic materials are the core materials of LCDs and OLEDs, respectively, whereas the micro LED display uses 1 µm to 100 µm of an LED chip itself as light emitting material.

Since the term "micro LED" emerged in a patent "MICRO-LED ARRAYS WITH ENHANCED LIGHT EXTRACTION" in 1999 (Korean Patent No. 10-0731673, hereinafter referred to as 'Related Art 1') disclosed by Cree Inc., related research papers based thereon were subsequently published. In order to apply micro LEDs to a display, it is necessary to develop a customized microchip based on a flexible material and/or flexible device using a micro LED device, and techniques of transferring micrometer-sized LED chips and accurately mounting the LED chips on a display pixel electrode are required.

Particularly, with regard to the transfer of the micro LED device to a display substrate, as the LED size is reduced to 1 µm to 100 µm, it is impossible to use a conventional pick-and-place machine, and a technology of a transfer head for higher precision is required. With respect to such a technology of a transfer head, several structures have been proposed as described below, but each of the proposed techniques has some problems.

Luxvue Technology Corp., USA, proposed a method of transferring micro LEDs using an electrostatic head (Korean Patent Application Publication No. 10-2014-0112486, hereinafter referred to as 'Related Art 2'). A transfer principle of the Related Art 2 is that a voltage is applied to a head portion made of a silicone material so that the head portion comes into close contact with micro LEDs due to electrification. However, this method may cause damage to micro LEDs due to electrification caused by the voltage applied to the head portion during induction of static electricity.

X-Celeprint Limited, USA, proposed a method of using an elastic polymer material as a transfer head and transferring micro LEDs positioned on a wafer to a desired substrate (Korean Patent Application Publication No. 10-2017-0019415, hereinafter referred to as 'Related Art 3'). According to the Related Art 3, there is no damage to micro LEDs as compared with the above-mentioned electrostatic head. However, an adhesive strength of the elastic transfer head is required to be higher than that of a target substrate in the transfer process to transfer micro LEDs stably, and an additional process for forming an electrode is required. In addition, maintaining an adhesive force of the elastic polymer material is an important factor.

Korea Photonics Technology Institute proposed a method of transferring a micro LED using a ciliary adhesive-structured head (Korean Patent No. 10-1754528, hereinafter referred to as 'Related Art 4'). However, in the Related Art 4, it is difficult to manufacture a ciliary adhesive structure.

Korea Institute of Machinery and Materials has proposed a method of transferring a micro LEDs using a roller coated with an adhesive (Korean Patent No. 10-1757404, hereinafter referred to as 'Related Art 5'). However, the Related Art 5 has a problem in that continuous use of the adhesive is required, and micro LEDs may be damaged when pressed with the roller.

Samsung Display Co., Ltd proposed a method of transferring micro LEDs to an array substrate according to electrostatic induction by applying a negative voltage to first and second electrodes of the array substrate in a state where the array substrate is immersed in a solution (Korean Patent Application Publication No. 10-2017-0026959, hereinafter referred to as 'Related Art 6'). However, the Related Art 6 has a problem in that a solution is required since the micro LEDs are immersed in the solution to transfer to the array substrate, and a drying process is required.

LG Electronics Inc. proposed a method in which a head holder is disposed between multiple pick-up heads and a substrate and a shape of the head holder is deformed by movement of the multiple pick-up heads such that the multiple pick-up heads are allowed to move freely (Korean Patent Application Publication No. 10-2017-0024906, hereinafter referred to as 'Related Art 7'). However, the Related Art 7 has a problem in that an additional process of applying a bonding material having an adhesive force to bonding surfaces of the pick-up heads is required to transfer micro LEDs.

In order to solve the problems of the related arts described above, it is necessary to solve the above-mentioned problems while adopting the basic principles adopted in the related arts. However, there is a limit to solving the problems because such problems are derived from the basic principles adopted in the related arts. Therefore, applicants of the present invention have not only solved the problems of the related arts but also proposed an advanced method which has not been considered in the related arts.

As illustrated in FIG. 1, in order to transfer multiple micro LEDs 100 to a display substrate or a target substrate (hereinafter, referred to as a second substrate) from a growth substrate, a temporary substrate, a carrier substrate (hereinafter, referred to as a first substrate 20), a transfer head grips the multiple micro LEDs 100 disposed on the first substrate 20 and cut into pieces. FIG. 1 is a view illustrating the related art which is a conceptional background of the present invention. As illustrated in FIG. 1, the micro LEDs 100 cut into pieces on the first substrate 20 may have different heights. In this case, when a transfer head 1 descends to grip the micro LEDs 100 positioned on the first substrate 20, some of the micro LEDs 100 may not be gripped onto a grip surface due to the different heights thereof. This not only reduces the grip efficiency of the transfer head 1 but also causes a problem of reducing the transfer efficiency. In addition, when the transfer head 1 further descends to grip some of the micro LEDs 100 not gripped onto the grip surface, the micro LEDs 100 already gripped are pressurized excessively, which may cause damage to the micro LEDs 100.

Alternatively, also in the case of the micro LEDs 100 having different heights, the transfer head 1 may grip the micro LEDs 100 while being spaced apart from the micro LEDs 100 by a distance. However, when gripping the micro LEDs 100 from the distance, a suction force for gripping the micro LEDs 100 onto the grip surface of a grip member 2 is weak so that gripping is not performed well. Accordingly, the transfer efficiency of the transfer head 1 is reduced thereby. In addition, there is a possibility that vortexes are generated in a space between some of the micro LEDs 100 not gripped from the first substrate 20 and the grip member 2 of the transfer head 1 due to the different heights of the micro LEDs 100. Thus, positional errors of some of the micro LEDs not gripped from the first substrate 20 may be caused, which may further reduce the grip efficiency and the transfer efficiency.

DOCUMENTS OF RELATED ART (Patent Document 1) Korean Patent No. 10-0731673;
(Patent Document 2) Korean Patent Application Publication No. 10-2014-0112486;
(Patent Document 3) Korean Patent Application Publication No. 10-2017-0019415;
(Patent Document 4) Korean Patent No. 10-1754528;
(Patent Document 5) Korean Patent No. 10-1757404;
(Patent Document 6) Korean Patent Application Publication No. 10-2017-0026959; and
(Patent Document 7) Korean Patent Application Publication No. 10-2017-0024906.

SUMMARY OF THE INVENTION

Accordingly, the present invention has been made keeping in mind the above problems occurring in the related art, and an objective of the present invention is to provide a transfer head gripping and transferring micro LEDs in a batch manner without error even when the micro LEDs have a difference in height.

In order to achieve the above objective, there is provided a transfer head transferring micro LEDs from a first substrate to a second substrate, the transfer head including: a grip member provided with dams and onto which the micro LEDs are gripped by a suction force generated inside the dams.

The grip member may be an anodic oxide film formed by anodizing a metal.

The grip member may be a porous grip member having arbitrary pores.

The grip member may be a porous grip member having vertical pores.

The dams may be provided at a pitch distance same as a pitch distance of the micro LEDs disposed on the first substrate.

The dams may be provided at a pitch distance in at least one of horizontal and vertical directions three times a pitch distance in the one or both directions of the micro LEDs disposed on the first substrate.

The pitch distance in the horizontal direction of the dams may be three times the pitch distance in the horizontal direction of the micro LEDs disposed on the first substrate, and the pitch distance in the vertical direction of the dams may be the same as the pitch distance in the vertical direction of the micro LEDs disposed on the first substrate.

The anodic oxide film may be configured with through-holes.

The dams may be made of an elastic material.

As described above, even when there is a height difference of micro LEDs to be transferred by the transfer head according to the present invention, the dams receive the height difference in the micro LEDs so that the transfer head can grip the micro LEDs. Accordingly, even when the grip process is performed on the micro LEDs having different heights, the micro LEDs can be gripped and transferred in a batch manner without any error, thereby improving the grip efficiency and the transfer efficiency.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Figure 1:
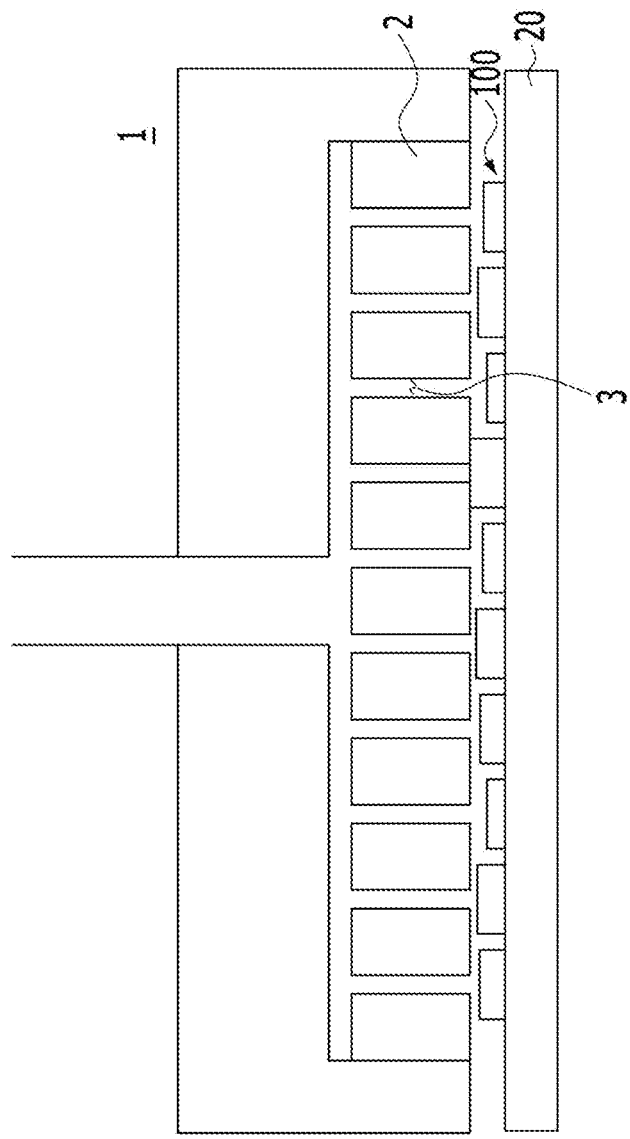
FIG. 1 is a view illustrating the related art which is a conceptional background of the present invention.

Contents of the description below merely exemplify the principle of the invention. Therefore, those of ordinary skill in the art may implement the theory of the invention and invent various apparatuses which are included within the concept and the scope of the invention even though it is not clearly explained or illustrated in the description. Furthermore, in principle, all the conditional terms and embodiments listed in this description are clearly intended for the purpose of understanding the concept of the invention, and one should understand that this invention is not limited the exemplary embodiments and the conditions.

The above described objectives, features, and advantages will be more apparent through the following detailed description related to the accompanying drawings, and thus those of ordinary skill in the art may easily implement the technical spirit of the invention.

The embodiments of the present invention are described with reference to cross-sectional views and/or perspective views which schematically illustrate ideal embodiments of the present invention. For explicit and convenient description of the technical content, sizes or thicknesses of films and regions and diameters of holes in the figures may be exaggerated. Therefore, variations from the shapes of the illustrations as a result, for example, of manufacturing techniques and/or tolerances, are to be expected. In addition, a limited number of multiple micro LEDs are illustrated in the drawings. Thus, the embodiments should not be construed as limited to the particular shapes of regions illustrated herein but are to include deviations in shapes that result, for example, from manufacturing.

Wherever possible, the same reference numerals will be used throughout different embodiments and the description to refer to the same or like elements or parts. In addition, the configuration and operation already described in other embodiments will be omitted for convenience.

Hereinafter, embodiments of the present invention will be described in detail with reference to the accompanying drawings.

Figure 2:
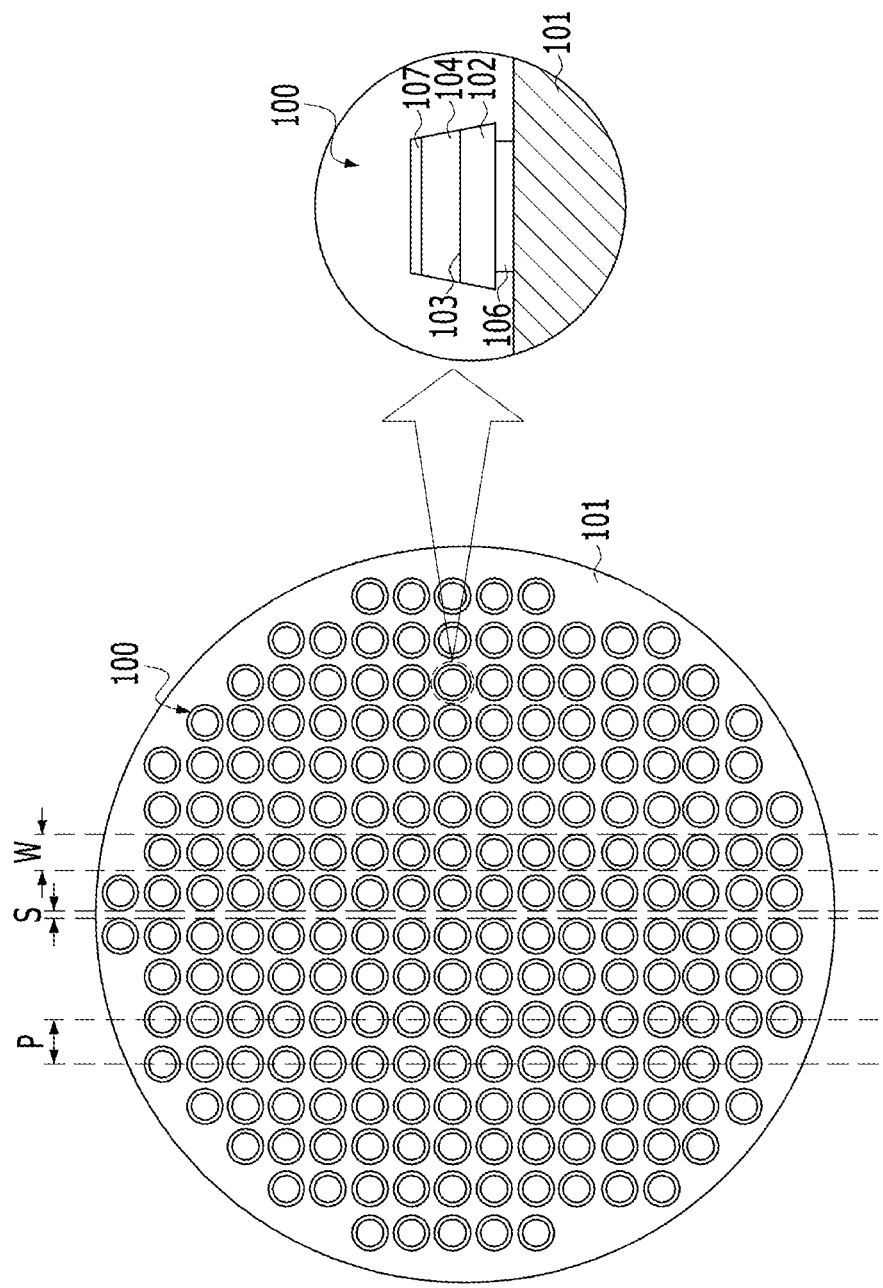
FIG. 2 is a view illustrating micro LEDs to be transferred according to an embodiment of the present invention.

FIG. 2 is a view illustrating micro LEDs 100 to be transferred by a transfer head 10 according to an embodiment of the present invention. The micro LEDs 100 are fabricated and disposed on a growth substrate 101.

The growth substrate 101 may be embodied by a conductive substrate or an insulating substrate. For example, the growth substrate 101 is made of at least one selected from among the group consisting of sapphire, SiC, Si, GaAs, GaN, ZnO, GaP, InP, Ge, and $Ga_2O_3$.

Each of the micro LEDs 100 includes: a first semiconductor layer 102; a second semiconductor layer 104; an active layer 103 provided between the first semiconductor layer 102 and the second semiconductor layer 104; a first contact electrode 106; and a second contact electrode 107.

The first semiconductor layer 102, the active layer 103, and the second semiconductor layer 104 may be formed by performing metalorganic chemical vapor deposition (MOCVD), chemical vapor deposition (CVD), plasma-enhanced chemical vapor deposition (PECVD), molecular-beam epitaxy (MBE), hydride vapor phase epitaxy (HVPE), or the like.

The first semiconductor layer 102 may be implemented, for example, as a p-type semiconductor layer. A p-type semiconductor layer may be made of a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, AlInN, and the like, and the layer may be doped with a p-type dopant such as Mg, Zn, Ca, Sr, and Ba.

The second semiconductor layer 104 may be implemented, for example, as an n-type semiconductor layer. An n-type semiconductor layer may be made of a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InNInAlGaN, AlInN, and the like, and the layer may be doped with an n-type dopant such as Si, Ge, and Sn.

However, the present invention is not limited to this. The first semiconductor layer 102 may be implemented as an n-type semiconductor layer, and the second semiconductor layer 104 may be implemented as a p-type semiconductor layer.

The active layer 103 is a region where electrons and holes are recombined. As the electrons and the holes are recombined, the active layer 103 transits to a low energy level and generates light having a wavelength corresponding thereto. The active layer 103 may be made of a semiconductor material having a composition formula of $In_xAl_yGa_{1-x-y}N$ ($0 \leq x \leq 1$, $0 \leq y \leq 1$, $0 \leq x+y \leq 1$) and may have a single quantum well structure or a multi quantum well (MQW) structure. In addition, the active layer 103 may have a quantum wire structure or a quantum dot structure.

The first semiconductor layer 102 may be provided with the first contact electrode 106, and the second semiconductor layer 104 may be provided with the second contact electrode 107. The first contact electrode 106 and/or the second contact electrode 107 may include one or more layers and may be made of various conductive materials including a metal, conductive oxide, and conductive polymer.

The multiple micro LEDs 100 formed on the growth substrate 101 are separated into individual pieces by cutting along a cutting line using a laser or the like or by etching. Then, it is possible to separate the individual micro LEDs 100 from the growth substrate 101 by a laser lift-off process.

In FIG. 2, the letter 'P' denotes a pitch distance between the micro LEDs 100, 'S' denotes a separation distance between the micro LEDs 100, and 'W' denotes a width of each micro LED 100. Although FIG. 2 illustrates that each cross section of the micro LEDs 100 is circular, a cross section of the micro LEDs is not limited thereto. The micro LEDs 100 may have another cross section shape other than the circular cross section, according to a method of fabricating the micro LEDs 100 on the growth substrate 101. For example, the micro LEDs 100 may have a quadrangular cross-section.

Figure 3:
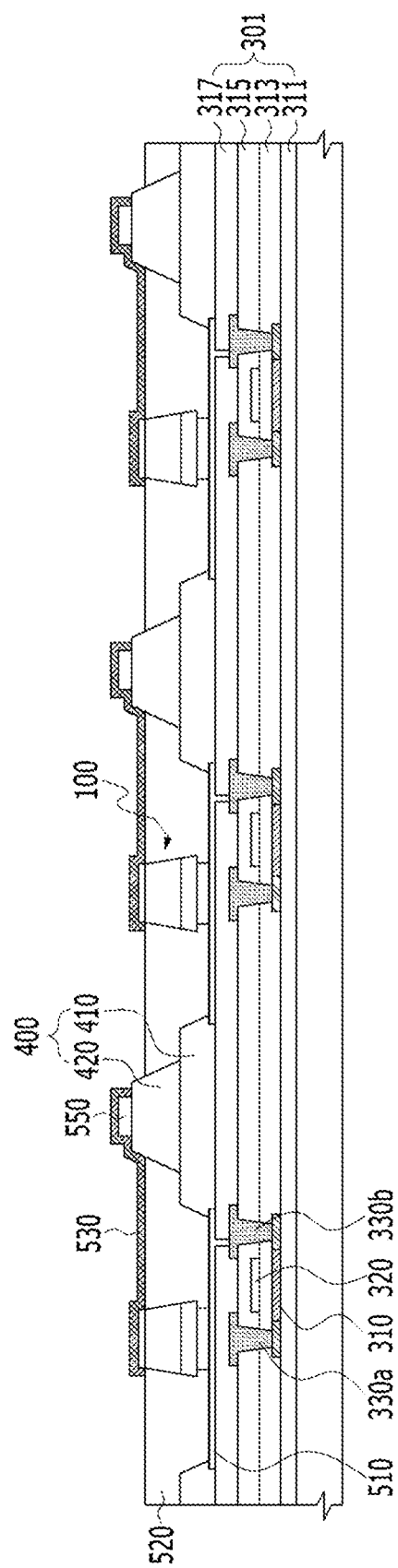
FIG. 3 is a view illustrating a micro LED structure in which the micro LEDs are transferred and mounted to a display substrate according to an embodiment of the present invention.

FIG. 3 is a view illustrating a micro LED structure formed by transferring and mounting the micro LEDs on a display substrate 301 using the transfer head 10.

The display substrate 301 may include various materials. For example, the display substrate 301 may be made of a transparent glass material having $SiO_2$ as a main component. However, materials of the display substrate 301 are not limited to this, and the display substrate 301 may be made of a transparent plastic material and have solubility. The plastic material may be an organic insulating substance selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP).

In the case of a bottom emission type in which an image is implemented in a direction of the display substrate 301, the display substrate 301 is required to be made of a transparent material. However, in the case of a top emission type in which an image is implemented in a direction opposite to the display substrate 301, the display substrate 301 is not required to be made of a transparent material. In this case, the display substrate 301 may be made of metal.

In the case of forming the display substrate 301 with metal, the display substrate 301 may be made of at least one metal selected from among the group consisting of iron, chromium, manganese, nickel, titanium, molybdenum, stainless steel (SUS), Invar, Inconel, and Kovar, but is not limited thereto.

The display substrate 301 may include a buffer layer 311. The buffer layer 311 provides a flat surface and blocks foreign matter or moisture from penetrating therethrough. For example, the buffer layer 311 may be made of an inorganic substance such as silicon oxide, silicon nitride, silicon oxynitride, aluminum oxide, aluminum nitride, titanium oxide, and titanium nitride, or an organic substance such as polyimide, polyester, and acrylic. Alternatively, the buffer layer 311 may be formed in a stacked manner with the exemplified substances.

A thin-film transistor (TFT) may include an active layer 310, a gate electrode 320, a source electrode 330a, and a drain electrode 330b.

Hereinafter, a case where a TFT is a top gate type in which the active layer 310, the gate electrode 320, the source electrode 330a, and the drain electrode 330b are sequentially provided will be described. However, the present embodiment is not limited thereto, and various types of TFTs such as a bottom gate TFT may be employed.

The active layer 310 may contain a semiconductor material, such as amorphous silicon and polycrystalline silicon. However, the present embodiment is not limited thereto, and the active layer 310 may contain various substances. For example, the active layer 310 may contain an organic semiconductor material or the like.

Alternatively, the active layer 310 may contain an oxide semiconductor material. For example, the active layer 310 may contain an oxide of a metal element selected from Groups 12, 13, and 14 elements such as zinc (Zn), indium (In), gallium (Ga), tin (Sn), cadmium (Cd), and germanium (Ge), and a combination thereof.

A gate dielectric layer 313 is provided on the active layer 310. The gate dielectric layer 313 serves to isolate the active layer 310 and the gate electrode 320. The gate dielectric layer 313 may be formed into a multilayer or a single layer of a film made of an inorganic substance such as silicon oxide and/or silicon nitride.

The gate electrode 320 is provided on the gate dielectric layer 313. The gate electrode 320 may be connected to a gate line (not illustrated) applying an on/off signal to the TFT.

The gate electrode 320 may be made of a low-resistivity metal. In consideration of adhesion with an adjacent layer, surface flatness of layers to be stacked, and processability, the gate electrode 320 may be formed into a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

An interlayer dielectric film 315 is provided on the gate electrode 320. The interlayer dielectric film 315 isolates the source electrode 330a, the drain electrode 330b, and the gate electrode 320. The interlayer dielectric film 315 may be formed into a multilayer or single layer of a film made of an inorganic substance. For example, the inorganic substance may be a metal oxide or a metal nitride. Specifically, the inorganic substance may include silicon dioxide ($SiO_2$), silicon nitrides ($SiN_x$), silicon oxynitride (SiON), aluminum oxide ($Al_2O_3$), titanium dioxide ($TiO_2$), tantalum pentoxide ($Ta_2O_5$), hafnium dioxide ($HfO_2$), or zirconium dioxide ($ZrO_2$).

The source electrode 330a and the drain electrode 330b are provided on the interlayer dielectric film 315. Each of the source electrode 330a and the drain electrode 330b may be formed into a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The source electrode 330a and the drain electrode 330b are electrically connected to a source region and a drain region of the active layer 310, respectively.

A planarization layer 317 is provided on the TFT. The planarization layer 317 is configured to cover the TFT, thereby eliminating steps caused by the TFT and planarizing the top surface. The planarization layer 317 may be formed into a single layer or a multilayer of a film made of an organic substance. The organic substance may include a general-purpose polymer such as polymethyl methacrylate (PMMA) and polystyrene (PS); a polymer derivative having phenols; polyacrylates; polyimides, poly(aryl ethers); polyamides; fluoropolymers; poly-p-xylenes; and polyvinyl alcohols; and a combination thereof. In addition, the planarization layer 317 may be formed into a multi-stack including an inorganic insulating layer and an organic insulating layer.

A first electrode 510 is provided on the planarization layer 317. The first electrode 510 may be electrically connected to the TFT. Specifically, the first electrode 510 may be electrically connected to the drain electrode 330b through a contact hole formed in the planarization layer 317. The first electrode 510 may have various shapes. For example, the first electrode 510 may be patterned in an island layout. A bank layer 400 defining a pixel region may be disposed on the planarization layer 317. The bank layer 400 may include a recess where each of the micro LEDs 100 will be received. The bank layer 400 may include, for example, a first bank layer 410 defining the recess. A height of the first bank layer 410 may be determined by a height and viewing angle of the micro LEDs 100. A size (width) of the recess may be determined by resolution, pixel density, and the like, of a display device. For example, the height of the micro LEDs 100 may be greater than the height of the first bank layer 410. The recess may have a quadrangular cross section, but is not limited to this. The recess may have various cross section shapes, such as polygonal, rectangular, circular, conical, elliptical, and triangular.

The bank layer 400 may further include a second bank layer 420 on the first bank layer 410. The first bank layer 410 and the second bank layer 420 have a step difference, and a width of the second bank layer 420 may be smaller than the width of the first bank layer 410. A conductive layer 550 may be disposed on the second bank layer 420. The conductive layer 550 may be disposed in a direction parallel to a data line or a scan line, and may be electrically connected to a second electrode 530. However, the present invention is not limited thereto. The second bank layer 420 may be omitted, and the conductive layer 550 may be disposed on the first bank layer 410. Alternatively, the second bank layer 420 and the conductive layer 550 may be omitted, and the second electrode 530 may be formed over the entire display substrate 301 such that the second electrode 530 serves as a shared electrode that pixels (P) share. The first bank layer 410 and the second bank layer 420 may include a material absorbing at least a part of light, a light reflective material, or a light scattering material. The first bank layer 410 and the second bank layer 420 may include an insulating material that is translucent or opaque to visible light (e.g., light in a wavelength range of 380 nm to 750 nm).

For example, the first bank layer 410 and the second bank layer 420 may be made of a thermoplastic such as polycarbonate (PC), polyethylene terephthalate (PET), polyethersulfone, polyvinyl butyral, polyphenylene ether, polyamide, polyetherimide, polynorbornene, poly(methyl methacrylate) resin, and cyclic polyolefin resin; a thermosetting plastic such as epoxy resin, phenolic resin, urethane resin, acrylic resin, vinyl ester resin, polyimide resin, urea resin, and melamine resin; or an organic insulating substance such as polystyrene, polyacrylonitrile, and polycarbonate, but are not limited thereto.

As another example, the first bank layer 410 and the second bank layer 420 may be made of an inorganic insulating substance such as inorganic oxide and inorganic nitride including $SiO_x$, $SiN_x$, $SiN_xO_y$, $AlO_x$, $TiO_x$, $TaO_x$, and $ZnO_x$, but are not limited thereto. For example, the first bank layer 410 and the second bank layer 420 may be made of an opaque material such as a material of a black matrix. A material of the insulating black matrix may include a resin or a paste including organic resin, glass paste, and black pigment; metal particles such as nickel, aluminum, molybdenum, and alloys thereof; metal oxide particles (e.g., chromium oxide); metal nitride particles (e.g., chromium nitride); or the like. Alternately, the first bank layer 410 and the second bank layer 420 may be a distributed Bragg reflector (DBR) having high reflectivity or a mirror reflector made of metal.

Each of the micro LEDs 100 is disposed in each recess. Each of the micro LEDs 100 may be electrically connected to the first electrode 510 at the recess.

The micro LEDs 100 emit light having wavelengths of different colors such as red, green, blue, white, and the like. With the micro LEDs 100, it is possible to realize white light by using fluorescent materials or by combining colors. Each of the micro LEDs 100 has a size of 1 µm to 100 µm. The micro LEDs 100 are picked up from the growth substrate 101 individually or collectively by a transfer head according to an embodiment of the present invention, transferred to the display substrate 301, and received in the recess of the display substrate 301.

Each of the micro LEDs 100 includes a p-n diode, the first contact electrode 106 disposed on one side of the p-n diode, and the second contact electrode 107 disposed on the opposite side of the first contact electrode 106. The first contact electrode 106 may be connected to the first electrode 510, and the second contact electrode 107 may be connected to the second electrode 530.

The first electrode 510 may include: a reflective layer made of Ag, Mg, Al, Pt, Pd, Au, Ni, Nd, Ir, Cr, or a compound thereof; and a transparent or translucent electrode layer provided on the reflective layer. The transparent or translucent electrode layer may be made of at least one selected from among the group consisting of indium tin oxide (ITO), indium zinc oxide (IZO), zinc oxide (ZnO), indium oxide ($In_2O_3$), indium gallium oxide (IGO), and aluminum zinc oxide (AZO).

A passivation layer 520 surrounds the micro LED 100 in the recess. The passivation layer 520 covers the recess and the first electrode 510 by filling a space between the bank layer 400 and each micro LED 100. The passivation layer 520 may be made of an organic insulating substance. For example, the passivation layer 520 may be made of acrylic, poly(methyl methacrylate) (PMMA), benzocyclobutene (BCB), polyimide, acrylate, epoxy, and polyester, but is not limited thereto.

The passivation layer 520 is formed to have a height not covering an upper portion of the micro LED 100, for example, a height not covering the second contact electrode 107, whereby the second contact electrode 107 is exposed. The second electrode 530 may be provided on the passivation layer 520 electrically connected to the exposed second contact electrode 107 of the micro LED 100.

The second electrode 530 may be disposed on the micro LED 100 and the passivation layer 520. The second electrode 530 may be made of a transparent conductive substance such as ITO, IZO, ZnO, and $In_2O_3$.

Figure 4:
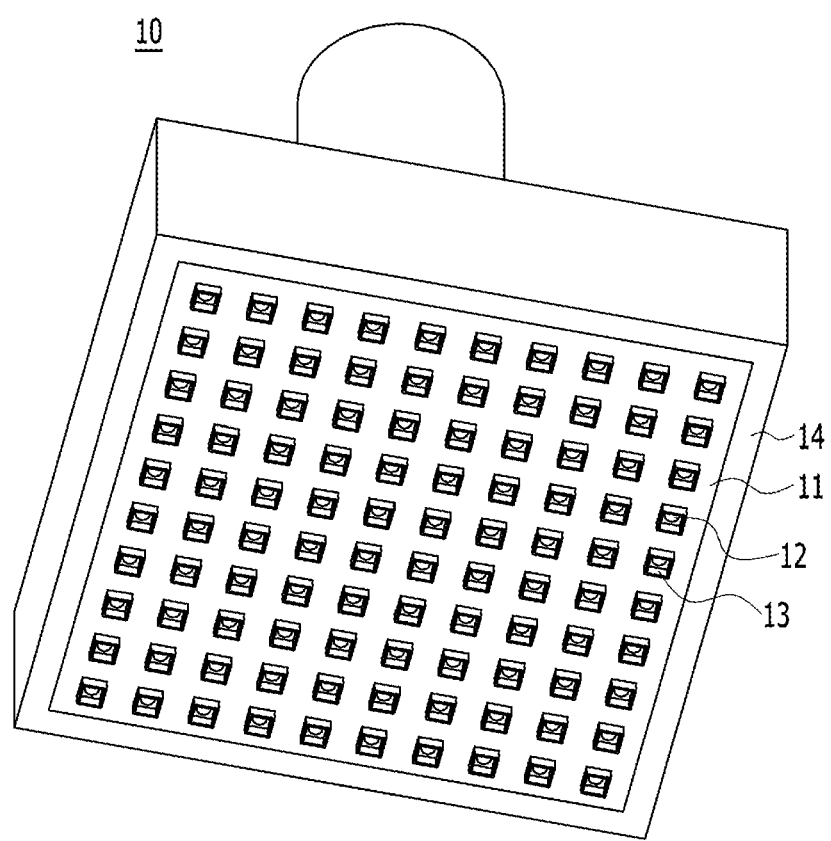
FIG. 4 is a view illustrating a transfer head according to an embodiment of the present invention.

Hereinbelow, the transfer head 10 according to an embodiment of the present invention will be described with reference to FIG. 4 and FIG. 5. FIG. 4 is a view illustrating the transfer head 10 according to the embodiment of the present invention. As illustrated in FIG. 4, the transfer head 10 according to the embodiment of the present invention includes: a grip member 11 provided with dams 13; and a support member 14 fixing and supporting the grip member 11. Accordingly, the transfer head 10 grips and transports the micro LEDs 100 of the first substrate 20 to a second substrate. The first substrate 20 is a substrate where cutting the micro LEDs 100 into pieces takes place. The first substrate 20 may be the same substrate as the growth substrate 101 of FIG. 2, a temporary substrate, or a carrier substrate. In addition, the second substrate is a substrate where the micro LEDs 100 gripped from the first substrate 20 are to be transferred. The second substrate may be the same substrate as the display substrate 301 of FIG. 3 or a target substrate.

The grip member 11 is configured with vacuum holes 12. The vacuum holes 12 are configured to extend from top to bottom of the grip member 11 so that a vacuum pressure is generated or released according to the operation of a vacuum pump (not illustrated).

The grip member 11 may be made of a material such as a metal, a non-metal, a ceramic, a glass, quartz, a silicone (PDMS), or a resin as long as the vacuum holes 12 can be formed to have a width of several tens of micrometers or less. In the case of the grip member 11 being made of a metal, it is possible to prevent the generation of static electricity while transferring the micro LEDs 100. In the case of the grip member 11 being made of a non-metal, it is possible to minimize the influence of the grip member 11 on the micro LEDs 100 having the property of metal. In the case of the grip member 11 being made of a ceramic, a glass, quartz, or the like, it is possible to secure rigidity and minimize positional error due to a low thermal expansion coefficient thereof, which may occur due to thermal deformation of the grip member 11 during the transfer of the micro LEDs 100. In the case of the grip member 11 being made of silicone (PDMS), it is possible to function as a buffer and minimize damage which may be caused by collision between the grip member 11 and the micro LEDs 100 when a lower surface of the grip member 11 and upper surfaces of the micro LEDs 100 are brought into contact with each other. In the case of the grip member 11 being made of resin, it is possible to facilitate the manufacture of the grip member 11.

The dams 13 are provided under the grip member 11. In detail, the dams 13 are provided under the grip member 11 in a manner that each of the dams 13 surrounds a bottom surface of each of the vacuum holes 12 of the grip member 11. As illustrated in FIG. 4, the dams 13 are provided at the bottom surface of the grip member 11 in a manner that each of the dams 13 surrounds the bottom surface of each of the vacuum holes 12 of the grip member 11. The dams 13 are individually provided so as to surround the bottom surface of each of the vacuum holes 12 configured in the grip member 11. Thus, the dams 13 may be configured to be upright at individual positions. Although FIG. 4 illustrates the dams 13 being in the form of a quadrangular frame, the shape of the dams 13 is not limited to this. The dams 13 may be provided in various shapes such as a circular frame.

A vacuum pressure applied to the vacuum holes 12 from a vacuum pump is transmitted to the dams 13 so that a suction force is generated inside the dams 13. Accordingly, the grip member 11 grips the micro LEDs 100 with the suction force inside the dams 13. When the grip member 11 descends to grip the micro LEDs 100, bottom surfaces of the dams 13 provided under the grip member 11 are brought into contact with the upper surfaces of the micro LEDs 100. The dams 13 may be made of an elastic material and provided at the grip member 11. Accordingly, when the grip member 11 descends to grip the micro LEDs 100 and the bottom surfaces of the dams 13 are brought into contact with the upper surfaces of the micro LEDs 100, the dams 13 function as a buffer so that it is possible to grip the micro LEDs 100 without causing damage to the micro LEDs 100.

In the case of the dams 13 being made of an elastic material, when detaching the micro LEDs 100 from the first substrate 20 through laser lift-off (LLO) process, the dams 13 function as a buffer preventing damage to the micro LEDs 100. For example, in the case that the first substrate 20 is the growth substrate 101, when detaching the micro LEDs 100 from the growth substrate 101 through the LLO process, the dams 13 function as a buffer between the growth substrate 101 and the micro LEDs 100 so that it is possible to prevent damage to the micro LEDs 100. Specifically, when performing a process of detaching the micro LEDs 100 from the growth substrate 101 through the LLO process, the micro LEDs 100 may be repelled from the growth substrate 101 toward the transfer head 1 due to the gas pressure. Therefore, it is troublesome to perform the LLO process in a state where a separate means is provided such as a supporting substrate capable of supporting the micro LEDs 100 from the upper side of the micro LEDs 100. However, according to the present invention, the dams 13 made of an elastic material function not only as a supporting means such as a supporting substrate while being in contact with the micro LEDs 100, but also as a buffer. Accordingly, it is possible to prevent damage to the micro LEDs 100 and to effectively separate the micro LEDs 100 from the growth substrate 101 through the LLO process.

Even in a case that the first substrate 20 is a temporary substrate or a carrier substrate, the dams 13 made of an elastic material prevent damage to the micro LEDs 100. For example, in a case that GaN is selected for semiconductor materials of the first semiconductor layer 102 and the second semiconductor layer 104 included in each of the micro LEDs 100, the first semiconductor layer 102 and the second semiconductor layer 104 may be damaged due to weak rigidity of GaN when the transfer head 10 and the micro LEDs 100 are brought into close contact with each other. However, according to the present invention, since the dams 13 made of an elastic material are provided, the dams 13 function as a buffer when the transfer head 10 and the micro LEDs 100 are brought into close contact with each other, thereby preventing damage to layers of the micro LEDs 100 such as the first semiconductor layer 102 and the second semiconductor layer 104.

The dams 13 may be made of a photoresist (PR) or a metal, and may be formed through an exposure process. In addition, the dams 13 may be formed by sputtering.

The transfer head 10 provided with the dams 13 may perform a process of gripping the micro LEDs 100 while being spaced apart from the micro LEDs 100. In this case, a material of the dams 13 is not limited to an elastic material. The dams 13 may be made of various materials such as a photoresist (PR) or a metal. When a transfer head 1 having no dams 13 performs the process of gripping the micro LEDs 100 having different heights while being spaced apart from the micro LEDs 100, the transfer head 1 grips the micro LEDs 100 with a vacuum suction force generated in vacuum holes 3 of a grip member 2. However, the vacuum suction force generated in the vacuum holes 3 is weak so that it is difficult to properly grip the micro LEDs 100 in a state of being spaced apart from the grip member 2. However, according to the present invention, the dams 13 are provided below the vacuum holes 12 so that the vacuum pressure of the vacuum pump is applied to the inside of the dams 13 through the vacuum holes 12. Since the dams 13 are provided to surround the bottom surfaces of the vacuum holes 12, a vacuum suction force generated in the dams 13 is greater than that of the vacuum holes 12. Accordingly, when gripping the micro LEDs 100 having different heights while being spaced apart from the transfer head 10 by a distance, it is possible to grip the micro LEDs 100 with the high vacuum suction force as compared with the case of gripping the micro LEDs 100 spaced apart from the transfer head 1 only with the vacuum suction force of the vacuum holes 3. As a result, the grip efficiency can be improved. For example, the transfer head 1 illustrated in FIG. 1 may be configured such that the area where the vacuum holes 3 are formed expands to increase the vacuum suction force. However, when the area of the vacuum holes 3 is large, more air is required to be discharged from the inside of the vacuum holes 3 to the outside according to the expanded area of the vacuum holes 3 in order to generate the vacuum suction force. In other words, it is required to increase the vacuum suction force, and it is achieved by using a large-capacity vacuum pump or changing output of the vacuum pump to a high level. However, according to the present invention, it is possible to generate the high vacuum suction force inside the dams 13 due to the vacuum pressure applied to the inside the dams 13 through the vacuum holes 12. Accordingly, the present invention can realize high efficiency of gripping the micro LEDs 100, which have different heights and are spaced apart from the transfer head, without needing to use a large-capacity vacuum pump or increase output of the vacuum pump to a high level.

An operation in which the grip member 11 provided with the dams 13 grips the micro LEDs 100 with the suction force inside the dams 13 will be described in detail with reference to FIG. 5A and FIG. 5B. In the following description, it is assumed that the dams 13 are in contact with the micro LEDs 100 to grip the micro LEDs 100.

Figure 5A:
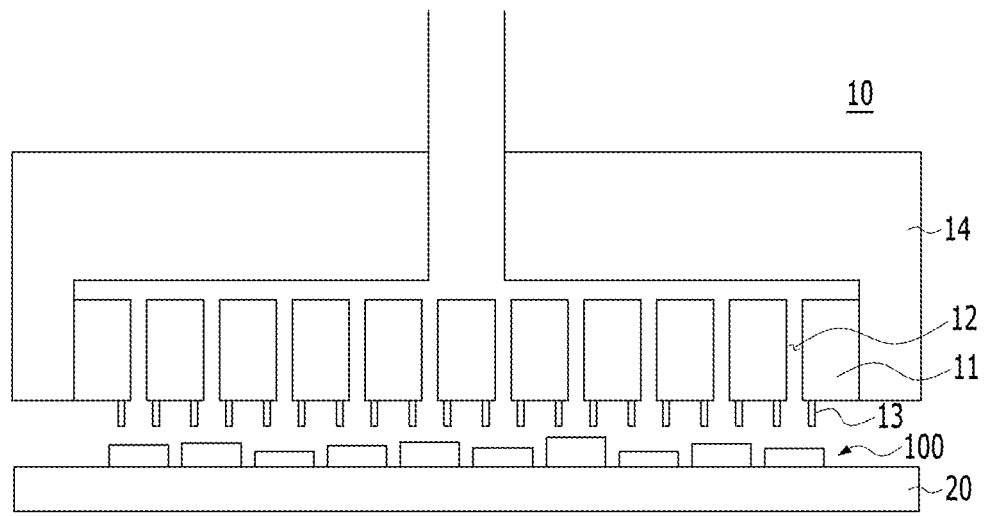
FIG. 5A and FIG. 5B are views illustrating an operation of the transfer head of FIG. 4.
Figure 5B:
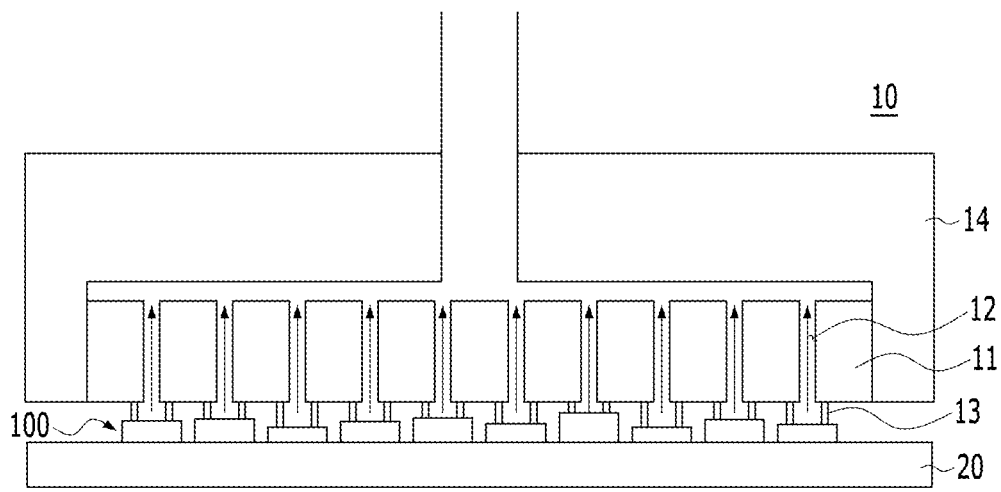

FIG. 5A is a view illustrating a state before the transfer head 10 according to the embodiment grips the micro LEDs 100 from the first substrate 20; and FIG. 5B is a view illustrating a state where the transfer head 10 according to the embodiment grips the micro LEDs 100 from the first substrate 20.

As illustrated in FIG. 5A and FIG. 5B, the micro LEDs 100 cut into pieces on the first substrate 20 may have different heights. FIG. 5A and FIG. 5B illustrate the height difference of the micro LEDs 100 being exaggerated for the sake of ease of explanation. In addition, FIG. 5A and FIG. 5B illustrate the dams 13 being provided at pitch distances same as the pitch distances in horizontal and vertical directions of the micro LEDs 100 disposed on the first substrate 20.

As illustrated in FIG. 5A, the dams 13 are provided under the grip member 11 at the pitch distances same as the pitch distances in the horizontal and vertical directions of the micro LEDs 100 disposed on the first substrate 20. The dams 13 are provided under the grip member 11 in a manner that each of the dams 13 surrounds the bottom surface of each of the vacuum holes 12. Accordingly, the vacuum pressure applied to the vacuum holes 12 from the vacuum pump is transmitted to the inside of the dams 13 so that the suction force is generated inside the dams 13. As a result, the grip member 11 grips the micro LEDs 100 disposed on the first substrate 20 with the suction force inside the dams 13. The micro LEDs 100 having different heights are in a state of being cut into pieces on the first substrate 20.

As illustrated in FIG. 5B, the transfer head 10 descends to grip the micro LEDs 100 disposed on the first substrate 20. Since the dams 13 are provided under the grip member 11 of the transfer head 10 on which the micro LEDs 100 are gripped, when the transfer head 10 descends to grip the micro LEDs 100, the bottom surfaces of the dams 13 are brought into contact with the upper surfaces of the micro LEDs 100. The dams 13 may be made of an elastic material and elastically deform when being brought into contact with the upper surfaces of the micro LEDs 100. Thus, it is possible to grip the micro LEDs 100 onto the grip member 11 with regardless of the height difference of the micro LEDs 100 having different heights and disposed on the first substrate 20. In addition, it is possible to grip all of the micro LEDs 100 onto the grip member 11 in a batch manner. In other words, when the transfer head 10 grips the micro LEDs 100 having different heights, the dams 13 provided at the grip member 11 receive the height difference in the micro LEDs 100. As a result, the transfer head 10 can grip the micro LEDs 100 in a batch manner, and the grip efficiency and the transfer efficiency can be improved.

The dams 13 will be described in detail, which receive the height difference of the micro LEDs 100. As illustrated in FIG. 5B, the dams 13 are configured to be upright at individual positions. Therefore, even when one of the dams 13 elastically deforms to receive the difference in distance between the grip member 11 and the micro LEDs 100, which is caused by the height difference of the micro LEDs 100, the remaining dams 13 are not affected by the deformation of the dam 13, and the micro LEDs 100 corresponding to the remaining dams 13 can be gripped. Referring to FIG. 5B, one of the dams corresponding to one micro LED of FIG. 5B which is the tallest among the micro LEDs (hereinafter, the tallest micro LED) receives the difference in distance between the grip member 11 and the tallest micro LED, thereby gripping the tallest micro LED. In this case, the dams 13 receive the difference in distance between the grip member 11 and the remaining micro LEDs 100 having different heights from the tallest micro LED so that the bottom surfaces of the dams 13 are in contact with the upper surfaces of the micro LEDs 100, thereby gripping all of the micro LEDs 100 in a batch manner without any error.

According to the related art, in the case of the transfer head 1 including the grip member 2 having no dams 13 as illustrated in FIG. 1, when gripping the micro LEDs 100 having different heights, some micro LEDs may be gripped onto the grip member 2, and some micro LEDs may not be gripped onto the grip member 2 due to the height difference of the micro LEDs 100. In other words, since there is a height difference of the micro LEDs 100 to be gripped by the transfer head 1, some micro LEDs are not gripped onto the grip member 2. This may cause the grip efficiency and the transfer efficiency of the transfer head 1 to be reduced.

In addition, the transfer head 1 having no dams 13 forcibly descends to grip the micro LEDs 100 not gripped yet so that the grip member 2 and the micro LEDs 100 are brought into contact with each other. Accordingly, the micro LEDs 100 already gripped by the transfer head 1 may be damaged thereby. Before describing this in detail, one micro LED which is the tallest among the micro LEDs 100 illustrated in FIG. 1 is referred to as the tallest micro LED hereinbelow for the sake of ease of explanation. When the transfer head 1 having no dams 13 descends to grip the micro LEDs 100 having different heights from the first substrate 20, only the tallest micro LED is gripped onto the grip member 2. The transfer head 1 descends further to grip the remaining micro LEDs in addition to the tallest micro LED. At this point, the tallest micro LED already gripped onto the grip member 2 is subjected to excessive pressure, resulting in damage to the tallest micro LED. In other words, when the transfer head 1 having no dams 13 grips the micro LEDs 100, the micro LEDs such as the tallest micro LED being in contact with the grip member 2 and gripped onto the transfer head 1 may be damaged due to the height difference of the micro LEDs 100 having different heights.

In addition, when only the tallest micro LED is gripped onto the bottom surface of the grip member 2, the grip member 2 and the remaining micro LEDs shorter than the tallest micro LED are spaced apart from each other by a distance. In this case, the vacuum pressure may be transmitted through the vacuum holes 3 of the grip member 2. In addition, vortexes may be generated in a space defined between the grip member 2 and the remaining micro LEDs shorter than the tallest micro LED gripped onto the grip member 2. The vortexes generated in the space may cause position errors of some of the micro LEDs on the first substrate 20 which are shorter than the tallest micro LED and thus are not gripped onto the grip member 2. As a result, the grip efficiency and the transfer efficiency of the transfer head 1 are further reduced.

However, according to the present invention, the dams 13 receive the height difference in the micro LEDs 100 having different heights, thereby improving the grip efficiency and the transfer efficiency of the transfer head 10. As illustrated in FIG. 5B, when there is a height difference of the micro LEDs 100 having different heights and the transfer head 10 grips the micro LEDs 100, the dams 13 provided at the bottom of the vacuum holes 12 of the grip member 11, respectively, are in contact with the micro LEDs 100. Specifically, the bottom surfaces of the dams 13 may be in contact with the upper surfaces of the micro LEDs 100. In this case, the transfer head 10 grips the micro LEDs 100 due to the dams 13, specifically, with the suction force inside the dams 13.

As illustrated in FIG. 5A and FIG. 5B, the dams 13 may be provided at the pitch distances the same as the pitch distances of the micro LEDs 100 disposed on the first substrate 20, corresponding to the micro LEDs 100 on the first substrate 20. When the transfer head 10 descends on the micro LEDs 100 which are disposed on the first substrate 20 and are not uniform in height as illustrated in FIG. 5B, the dams 13 on the respective micro LEDs 100 disposed on the first substrate 20 receive the difference in distance between the grip member 11 and the upper surfaces of the micro LEDs 100. As a result, it is possible to grip the micro LEDs 100 disposed on the first substrate 20 in a batch manner, thereby improving the transfer efficiency of the transfer head 10.

In addition, since the dams are provided to surround the bottom surfaces of the vacuum holes 12, the inner horizontal area of each of the dams 13 may be wider than the horizontal area of each of the vacuum holes 12. Thus, it is possible to grip the micro LEDs 100 with an increased vacuum area in comparison with the vacuum area defined in the vacuum holes 12. As a result, it is possible to perform the process of gripping the micro LEDs 100 with high efficiency, and to improve the grip efficiency and the transfer efficiency.

As illustrated in FIG. 4 to FIG. 5B, in the case of the dams 13 being provided at the pitch distances same as the pitch distances of the micro LEDs 100 disposed on the first substrate 20, the transfer head 10 grips the micro LEDs 100 from the first substrate 20 and transfers the micro LEDs 100 to the second substrate. Then, a color conversion layer may be provided on the micro LEDs 100, which are transferred to the second substrate, to constitute pixels. For example, in a case that the micro LEDs 100 on the first substrate 20 which are to be gripped by the transfer head 10 are red micro LEDs, the transfer head 10 grips the red micro LEDs from the first substrate 20 in a batch manner and transfers the red micro LEDs to the second substrate. A color conversion layer may be provided on the red micro LEDs transferred to the second substrate, and because of this, green and blue micro LEDs are obtained and pixels are constituted.

Figure 6:
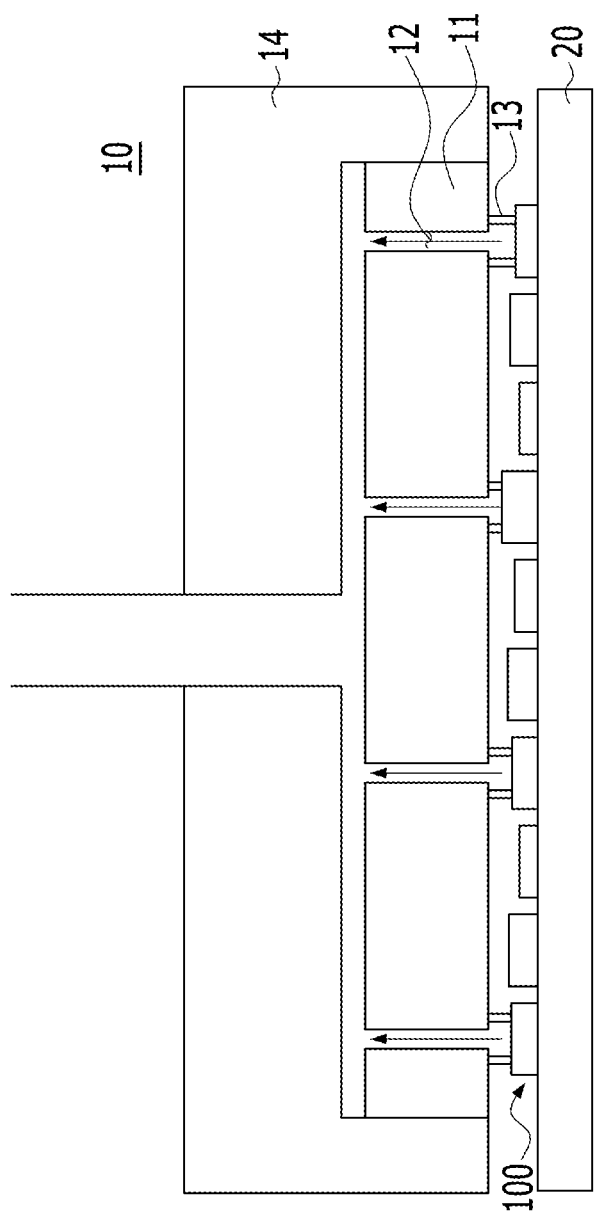
FIG. 6 is a view illustrating a first modification of the transfer head of FIG. 4.

The dams 13 may be provided at the pitch distance in at least one of the horizontal and vertical directions three times the pitch distance in the one or both directions of the micro LEDs 100 disposed on the first substrate 20. In other words, the dams 13 may be provided at the pitch distance in at least one of the horizontal and vertical directions three times the pitch distance in the one or both directions of the micro LEDs 100 disposed on the first substrate 20. For example, the dams 13 may be provided such that the pitch distance in the horizontal direction thereof is three times the pitch distance in the horizontal direction of the micro LEDs 100 disposed on the first substrate 20, and the pitch distance in the vertical direction thereof is the same as the pitch distance in the vertical direction of the micro LEDs 100 disposed on the first substrate 20. FIG. 6 is a view illustrating a first modification of the transfer head 10 according to the embodiment of the present invention. The first modification of the transfer head 10 differs from the transfer head 10 according to the embodiment in that a pitch distance of dams 13 of the first modification in the horizontal direction is three times the pitch distance in the horizontal direction of the micro LEDs 100 disposed on the first substrate 20.

FIG. 6 is a sectional view illustrating the first modification of the transfer head 10, taken along the horizontal direction. As illustrated in FIG. 6, vacuum holes 12 of a grip member 11 are provided such that a pitch distance thereof in the horizontal direction is three times the pitch distance in the horizontal direction of the micro LEDs 100 disposed on the first substrate 20, a pitch distance thereof in the vertical direction is the same as the pitch distance in the vertical direction of the micro LEDs 100 disposed on the first substrate 20. Dams 13 are individually provided below the vacuum holes 12 of the grip member 11. Thus, the dams 13 are provided such that a pitch distance thereof in the horizontal direction is three times the pitch distance in the horizontal direction of the micro LEDs 100 disposed on the first substrate 20, a pitch distance thereof in the vertical direction is the same as the pitch distance in the vertical direction of the micro LEDs 100 disposed on the first substrate 20.

As the first modification of the transfer head 10, when the dams 13 is provided such that the pitch distance thereof in the horizontal direction is three times the pitch distance in the horizontal direction of the micro LEDs 100 disposed on the first substrate 20, and the pitch distance thereof in the vertical direction is the same as the pitch distance in the vertical direction of the micro LEDs 100 disposed on the first substrate 20, it is possible to transfer the micro LEDs 100, which have different heights and are disposed on the first substrate 20, by the transfer head 10 in consideration of pixel arrangement. For example, a donor portion is provided and includes a first donor substrate on which red micro LEDs are disposed, a second donor substrate on which green micro LEDs are disposed, and a third donor substrate on which blue micro LEDs are disposed. Then, the first modification of the transfer head 10 may reciprocate three times between the first to third donor substrate and a target substrate to transfer the red, green, and blue micro LEDs of the donor portion to the second substrate (for example, the display substrate 301 illustrated in FIG. 3 or the target substrate). Accordingly, the red, green, blue micro LEDs constitute a 1×3 pixel arrangement. Due to the dams 13, the first modification of the transfer head 10 is allowed to grip and transfer the micro LEDs 100 having different heights in consideration of pixel arrangement on the second substrate without any error, thereby improving the transfer efficiency.

Figure 7:
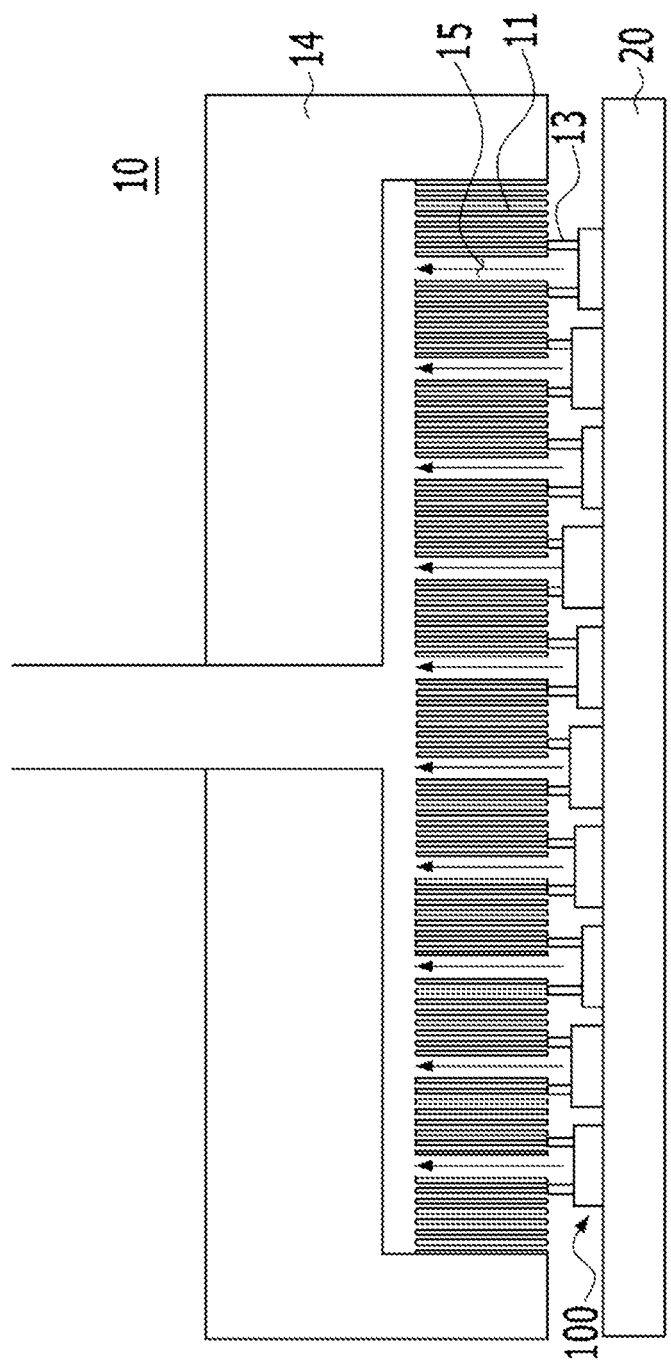
FIG. 7 is a view illustrating a second modification of the transfer head of FIG. 4.

FIG. 7 is a view illustrating a second modification of the transfer head 10 according to the embodiment of the present invention. The second modification differs from the embodiment in that a grip member 11 provided with dams 13 is an anodic oxide film formed by anodizing a metal.

As illustrated in FIG. 7, the grip member 11 of the second modification of the transfer head 10 may be an anodic oxide film formed by anodizing a metal. In the anodic oxide film, pores are arranged regularly. The anodic oxide film is a film formed by anodizing a metal that is a base material, and the pores are formed in a process of forming the anodic oxide film by anodizing the metal. For example, in the case where a metal base material is aluminum (Al) or an aluminum alloy, the anodization of the base material forms the anodic oxide film consisting of anodized aluminum ($Al_2O_3$) on a surface of the base material. The anodic oxide film formed as described above includes a barrier layer in which no pores are formed and a porous layer in which the pores are formed inside. The barrier layer is positioned on an upper portion of the base material, and the porous layer is positioned below the barrier layer. After removing the base material on which the anodic oxide film having the barrier layer and the porous layer is formed, only the anodic oxide film consisting of anodized aluminum ($Al_2O_3$) remains.

The anodic oxide film has the pores configured vertically and having a regular arrangement with a uniform diameter. Accordingly, after removing the barrier layer, the pores have a structure extending from top to bottom vertically, thereby facilitating the generation of the vacuum pressure in the vertical direction.

The inside of the anodic oxide film forms air flow paths vertically by the vertical pores. An internal width of the pores has a size of several nanometers to several hundred nanometers. For example, when a size of the micro LEDs 100 to be vacuum-sucked is 30 μm×30 μm and an internal width of the pores is several nanometers, it is possible to vacuum-suck the micro LEDs 100 by approximately tens of millions of pores. The micro LEDs 100 are lightweight because each of the micro LEDs 100 are fundamentally configured only with the first semiconductor layer 102, the second semiconductor layer 104, the active layer 103 provided between the first semiconductor layer 102 and the second semiconductor layer 104, the first contact electrode 106, and the second contact electrode 107. Accordingly, it is possible to vacuum-suck the micro LEDs 100 by tens of thousands to tens of millions of pores formed in the anodic oxide film.

In addition, through-holes 15 may be configured in the anodic oxide film. The through-holes 15 may be provided at pitch distances in the horizontal and vertical directions same as the pitch distances in the horizontal and vertical directions of the micro LEDs 100 disposed on the first substrate 20. The dams 13 are provided below the through-holes 15 of the anodic oxide film with pitch distances in the horizontal and vertical directions same as the pitch distances in the horizontal and vertical directions of the micro LEDs 100 disposed on the first substrate 20.

The anodic oxide film has pores formed spontaneously. The through-holes 15 may be formed by etching the anodic oxide film to a width wider than the width of the pores. The through-holes 15 of the anodic oxide film may function as the vacuum holes 12 of the embodiment do. A vacuum pressure of a vacuum pump may be applied to the through-holes 15, and the vacuum pressure is transmitted to the inside of the dams 13 provided below the through-holes 15 so that a suction force is generated inside the dams 13 with vacuum areas larger than those of the through-holes 15. The micro LEDs 100 are gripped onto the grip member 11 with the suction force. In addition, while the second modification of the transfer head 10 grips the micro LEDs 100, the dams 13 receive the difference in distance between the micro LEDs 100 and the grip member 11, which results from the micro LEDs 100 having different heights. Accordingly, the transfer head 10 performs the efficient grip process without any error.

In the case where the grip member 11 is embodied by the anodic oxide film, no through-holes 15 may be provided. Thus, the vacuum pressure is applied to the pores spontaneously formed in the anodic oxide film, and the vacuum pressure is transmitted through the pores to the inside of the dams 13, thereby generating a suction force. In this case, the dams 13 may be provided under the anodic oxide film at positions corresponding to positions of the micro LEDs 100 disposed on the first substrate 20.

The dams 13 may be provided at pitch distances in the horizontal and vertical directions same as the pitch distances in the horizontal and vertical directions of the micro LEDs 100 disposed on the first substrate 20. Alternatively, the dams 13 may be provided at the pitch distance in at least one of the horizontal and vertical directions three times the pitch distance in the one or both directions of the micro LEDs 100 disposed on the first substrate 20. Due to the dams 13 provided as above, it is possible to perform the grip process in consideration of pixel arrangement.

Figure 8:
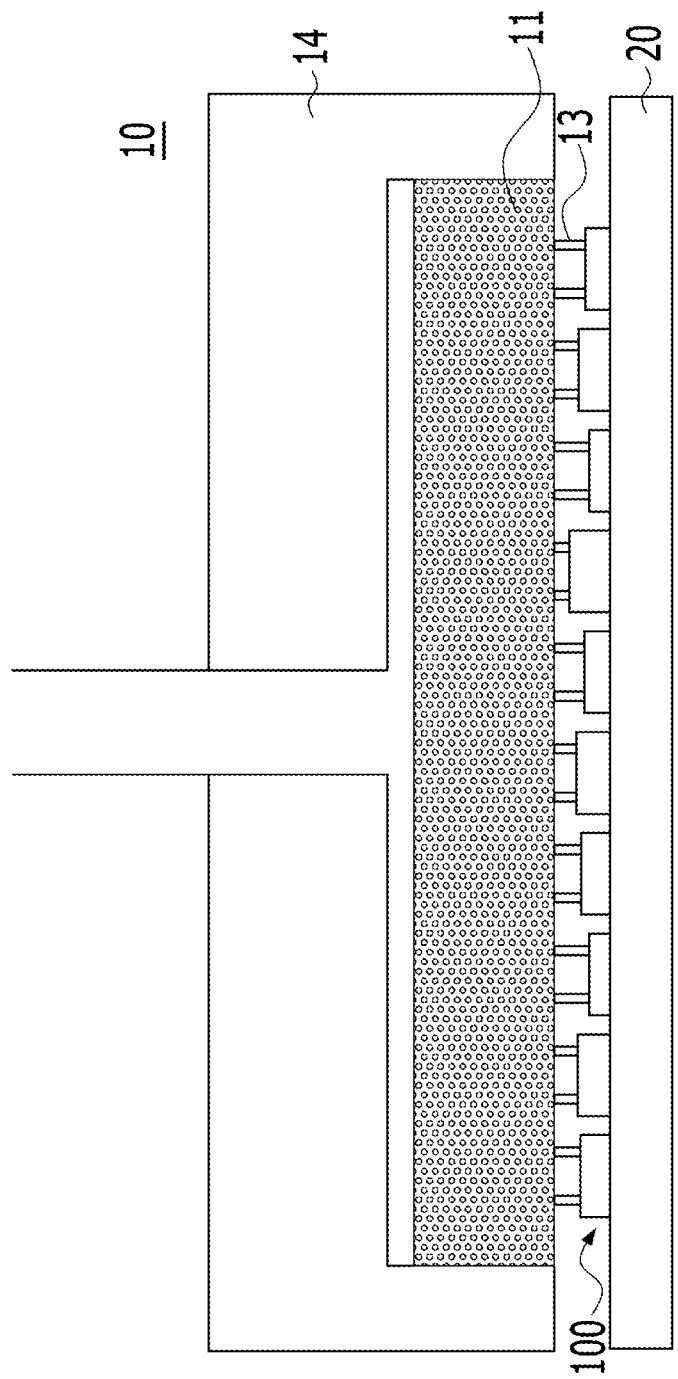
FIG. 8 is a view illustrating a third modification of the transfer head of FIG. 4.

FIG. 8 is a view illustrating a third modification of the transfer head 10 according to the embodiment of the present invention. The third modification differs from the embodiment in that a grip member 11 provided with dams 13 is a porous grip member having arbitrary pores.

As illustrated in FIG. 8, the grip member 11 of the third modification of the transfer head 10 may be a porous grip member having arbitrary pores. In a case where the porous grip member having the arbitrary pores has a disordered pore structure, the multiple pores are connected to each other inside the porous grip member such that air flow paths are formed and connect upper and lower portions of the porous grip member having the arbitrary pores. In the porous grip member having arbitrary pores, the multiple pores having a predetermined arrangement or a disordered pore structure are connected to each other so that air flows in the horizontal direction. Accordingly, a vacuum pressure is applied to the dams 13 provided under the porous grip member having the arbitrary pores so that a suction force is generated.

The dams 13 are provided under the porous grip member having arbitrary pores. The dams 13 may be provided at pitch distances in the horizontal and vertical directions same as the pitch distances in the horizontal and vertical directions of the micro LEDs 100 disposed on the first substrate 20 so that the micro LEDs 100 are gripped in a batch manner thereby. Alternatively, the dams 13 may be provided at the pitch distance in at least one of the horizontal and vertical directions three times the pitch distance in the one or both directions of the micro LEDs 100 disposed on the first substrate 20 such that it is possible to perform the grip process in consideration of pixel arrangement.

The grip member 11 may be a porous grip member having vertical pores. In the case where the grip member 11 is the porous grip member having the vertical pores, the vertical pores may be formed by a laser, etching, or the like. The inside of the porous grip member having the vertical pores, the vertical pores extend from top to bottom of the grip member 11 such that air flow paths are formed. Types of the porous grip member having the vertical pores may include the anodic oxide film of the first modification described above.

Under the porous grip member having vertical pores, the dams 13 may be provided at the pitch distances in the horizontal and vertical directions same as the pitch distances in the horizontal and vertical directions of the micro LEDs 100 disposed on the first substrate 20. Alternatively, the dams 13 may be provided at the pitch distance in at least one of the horizontal and vertical directions three times the pitch distance in the one or both directions of the micro LEDs 100 disposed on the first substrate 20. The dams 13 receive the height difference of the micro LEDs 100 disposed on the first substrate 20, thereby gripping the micro LEDs 100 onto the porous grip member having the vertical pores without any error.

According to each of the embodiment and the modifications of the present invention, the dams 13 are provided under the grip member 11. Thus, even when the micro LEDs 100 to be transferred by the transfer head 10 have different heights, the transfer head 10 grips and transfers the micro LEDs 100 from the first substrate 20 in a batch manner without any error. This is achieved by the dams 13 accommodating difference in distance between the grip member 11 and the micro LEDs 100 having different heights, whereby the micro LEDs 100 can be gripped. Accordingly, the transfer head 10 can have improved grip efficiency and transfer efficiency.

Although the present invention has been described the micro LEDs 100 as targets to be transferred, the present invention can also be applied to unpackaged micro LEDs having a standardized size of several hundreds micrometers.

As described above, the present invention has been described with reference to the embodiments. However, those skilled in the art will appreciate that various modifications, additions and substitutions are possible, without departing from the scope and spirit of the invention as disclosed in the accompanying claims.

What is claimed is:

1. A transfer head transferring micro LEDs from a first substrate to a second substrate, the transfer head comprising:
   a grip member; and
   dams provided at a bottom surface of the grip member,
   wherein the grip member is an anodic oxide film having vertical pores formed by anodizing a metal,
   wherein the anodic oxide film is provided with through-holes formed by etching the anodic oxide film, a width of each of the through-holes being wider than a width of each of the vertical pores,
   wherein each of the through-holes is provided at an inside of each of the dams, and
   wherein the micro LEDs are gripped onto the grip member by a suction force generated inside the dams through the through-holes.

2. The transfer head of claim 1, wherein the dams are provided at a pitch distance same as a pitch distance of the micro LEDs disposed on the first substrate.

3. The transfer head of claim 1, wherein a pitch distance in a horizontal direction of the dams is three times as long as a pitch distance in the horizontal direction of the micro LEDs disposed on the first substrate.

4. The transfer head of claim 1, wherein the dams are made of an elastic material.

* * * * *